United States Patent
Fukuda et al.

(10) Patent No.: US 7,505,318 B2
(45) Date of Patent: Mar. 17, 2009

(54) NONVOLATILE SEMICONDUCTOR MEMORY DEVICE

(75) Inventors: Yasuyuki Fukuda, Kamakura (JP); Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 110 days.

(21) Appl. No.: 11/610,193

(22) Filed: Dec. 13, 2006

(65) Prior Publication Data

US 2007/0133291 A1 Jun. 14, 2007

(30) Foreign Application Priority Data

Dec. 14, 2005 (JP) .............................. 2005-360440

(51) Int. Cl.
*G11C 11/34* (2006.01)
(52) U.S. Cl. .................... 365/185.09; 365/185.11; 365/185.12; 365/185.17; 365/185.33
(58) Field of Classification Search ............ 365/185.03, 365/185.09, 185.11, 185.17, 185.18, 185.29, 365/185.33, 185.12
See application file for complete search history.

(56) References Cited

U.S. PATENT DOCUMENTS

| | | | |
|---|---|---|---|
| 5,086,413 A | 2/1992 | Tsuboi et al. | |
| 5,818,773 A | 10/1998 | Takahashi | |
| 5,996,041 A * | 11/1999 | Kim .................. | 365/185.29 |
| 6,657,891 B1 | 12/2003 | Shibata et al. | |
| 6,671,204 B2 * | 12/2003 | Im ...................... | 365/185.12 |
| 6,717,857 B2 * | 4/2004 | Byeon et al. .......... | 365/185.17 |
| 6,813,184 B2 * | 11/2004 | Lee ....................... | 365/185.09 |
| 6,876,578 B2 * | 4/2005 | Shibata et al. ......... | 365/185.03 |
| 6,925,004 B2 | 8/2005 | Shibata et al. | |
| 6,992,929 B2 | 1/2006 | Chen et al. | |
| 7,016,226 B2 | 3/2006 | Shibata et al. | |
| 7,042,770 B2 * | 5/2006 | Lee et al. ............... | 365/185.12 |
| 7,057,939 B2 * | 6/2006 | Li et al. ................. | 365/185.03 |
| 7,227,785 B2 * | 6/2007 | Lee et al. ............... | 365/185.12 |

(Continued)

FOREIGN PATENT DOCUMENTS

JP 3-137900 6/1991

(Continued)

OTHER PUBLICATIONS

U.S. Appl. No. 11/564,618, filed Nov. 29, 2006, Shibata et al.
U.S. Appl. No. 11/610,193, filed Dec. 13, 2006, Fukuka et al.

*Primary Examiner*—Trong Phan
(74) *Attorney, Agent, or Firm*—Oblon, Spivak, McClelland, Maier & Neustadt, P.C.

(57) ABSTRACT

A nonvolatile semiconductor memory device of the present invention is characterized in that, when data is written to a flag cell area, every other flag cell in the direction of one bit line BL among a plurality of flag cells 15 connected to the bit line BL is written with data and every other flag cell in the direction of one word line WL among a plurality of flag cells 15 connected to the word line WL is written with data. The arrangement as described above prevents a flag cell 15 from being influenced by the capacitive coupling of a neighboring flag cell 15 adjacent to the flag cell 15 in the direction of the word line WL. Thus, data (flag data) memorized by the flag cell 15 can have improved reliability.

20 Claims, 12 Drawing Sheets

U.S. PATENT DOCUMENTS

| | | | |
|---|---|---|---|
| 7,292,474 B2 * | 11/2007 | Iino et al. | 365/185.03 |
| 7,315,471 B2 * | 1/2008 | Shibata et al. | 365/185.03 |
| 7,376,009 B2 * | 5/2008 | Shibata et al. | 365/185.03 |
| 2002/0051383 A1 | 5/2002 | Mangan et al. | |
| 2004/0027865 A1 | 2/2004 | Mangan et al. | |
| 2005/0111259 A1 | 5/2005 | Fukuda et al. | |
| 2006/0120162 A1 | 6/2006 | Fujiu et al. | |

FOREIGN PATENT DOCUMENTS

| | | |
|---|---|---|
| JP | 6-44789 | 2/1994 |
| JP | 2004-192789 | 7/2004 |
| JP | 2004-524638 | 8/2004 |
| JP | 2006-139864 | 6/2006 |
| WO | WO 02/058073 A2 | 7/2002 |

* cited by examiner

NONVOLATILE SEMICONDUCTOR MEMORY DEVICE

CROSS-REFERENCE TO RELATED APPLICATIONS

This application is based upon and claims the benefit of priority from the prior Japanese Patent Applications No. 2005-360440, filed on Dec. 14, 2005, the entire contents of which are incorporated herein by reference.

TECHNICAL FIELD

The present invention relates to a nonvolatile semiconductor memory device.

BACKGROUND OF THE INVENTION

Recently, the demand for nonvolatile semiconductor memory devices which are small in size and have a large capacity has dramatically increased. In particular, more attention has been paid to NAND flash memories because of its greater possibility for higher integration and capacity than those of conventional NOR flash memories.

A NAND-type flash memory includes a memory cell array in which a plurality of electrically-rewritable memory cells MTr are arranged in a matrix manner. This memory cell array has a plurality of memory cells MTr connected in series as a basic unit (NAND cell unit). This NAND cell unit is structured so that one end is connected via a selection gate transistor Tr0 to a bit line BL and the other end is connected via a selection gate transistor Tr1 to a common source line SOURCE. The bit line BL-side selection gate transistor Tr0 and the common source line SOURCE-side selection gate transistor Tr1 sandwich a plurality of memory cells MTr. Each of the memory cells MTr is connected by one word line WL to constitute a unit called a "page". A collection of the pages constitutes a block (e.g., Japanese Patent Unexamined Publication No. 2004-192789).

In a NAND-type flash memory, data is collectively read out from and written to each page. A page is divided into a data area and a redundancy area. The data area is generally used for storing data to-be-memorized hand codes for Error Checking and Correcting (ECC). The redundancy area is used for storing a logic address and a flag data showing the right and wrong of a block page for example.

The reliability of a conventional NAND-type flash memory's flag data has been damaged due to the influence of capacitive coupling.

SUMMARY OF THE INVENTION

According to one embodiment of the present invention, a memory cell array having a plurality of memory cell units in which a plurality of electrically rewritable memory cells are connected in series; a plurality of word lines connected to control gates of the plurality of memory cells, respectively; a bit line connected to one end of the memory cell unit; and a source line connected to the other end of the memory cell unit; wherein: the plurality of memory cells connected to the one word line constitute a unit of page, the page has a flag cell area, and when the flag cell area is written with data, alternation memory cell among the plurality of memory cells arranged in the bit line direction in a plurality of memory cells connected to the one bit line is written with data and alternation memory cell among the plurality of memory cells arranged in the word line direction in the plurality of memory cells connected to the one word line is written with data.

In addition, according to one embodiment of the present invention, a memory cell array having a plurality of memory cell units in each of which a plurality of electrically rewritable memory cells are connected in series; a plurality of word lines connected to control gates of the plurality of memory cells, respectively; a bit line connected to one end of the memory cell unit; and a source line connected to the other end of the memory cell unit; wherein: the plurality of memory cells connected to the one word line constitute a unit of page, the page has a flag cell area, and when the flag cell area is written with data, in a plurality of memory cells connected to the one word line, a memory cell written with data and a memory cell not written with data are alternately provided, for every group of a plurality of memory cells sharing the one bit line, in the word line direction.

BREIF DESCRIPTION OF THE DRAWINGS

[FIG. 1]

[FIG. 2]

[FIG. 3]

[FIG. 4]

[FIG. 5]

[FIG. 6]

[FIG. 7]

[FIG. 8]

[FIG. 9]

[FIG. 10]

[FIG. 11]

[FIG. 12]

DETAILED DESCRIPTION OF THE INVENTION (History of how the Invention was Achieved)

In a NAND-type flash memory, flag data (e.g., information of the page) is written to a redundancy area by writing the flag data to a memory cell (flag cell) in the redundancy area with the same test pattern for every page. Thus, the flag cell is influenced by neighboring flag cells in the direction of the word line WL due to capacitive coupling, thereby causing a fluctuation in the distribution of threshold values of the flag cell. As a result, this may cause the flag cell to have data with poor reliability.

Figure 6:
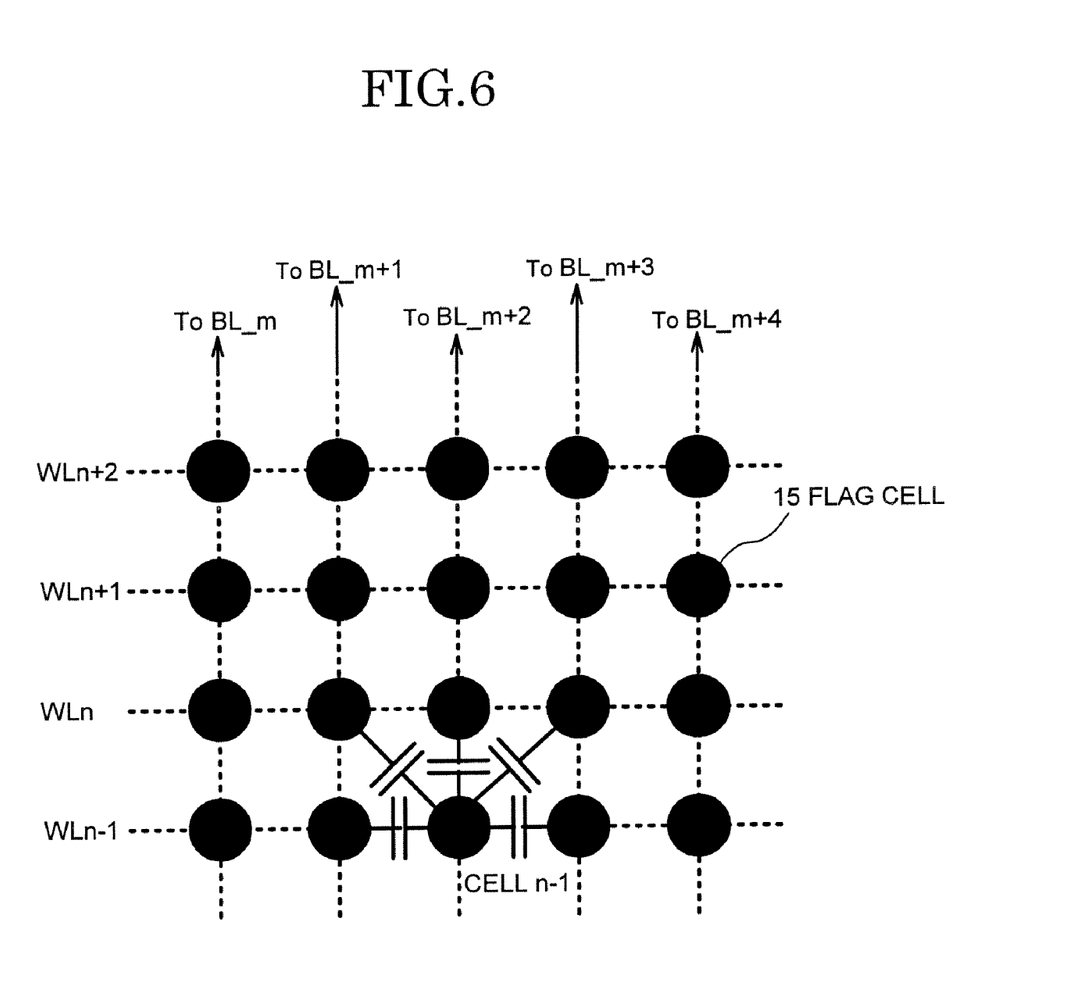
FIG. 6 is a schematic diagram illustrating an example of the influence from flag cells surrounding a flag cell of a NAND-type flash memory to the flag cell due to capacitive coupling when the flag cell is written with data.

With reference to FIG. 6, the following section will describe the influence to a flag cell of a NAND-type flash memory from flag cells surrounding the flag cell due to capacitive coupling when the flag cell is written with data. FIG. 6 illustrates a part of a flag cell area of the page and schematically illustrates a flag cell 15 written with flag data by ● (black circle). In FIG. 6, the longitudinal dashed line is connected to a bit line BL ( . . . , BL_m, BL_m+1, . . . , BL_m+4, . . . ). In FIG. 6, the lateral dashed line represents a word line WL ( . . . , WLn−1, WLn, WLn+1, WLn+2, . . . ).

Figure 7:
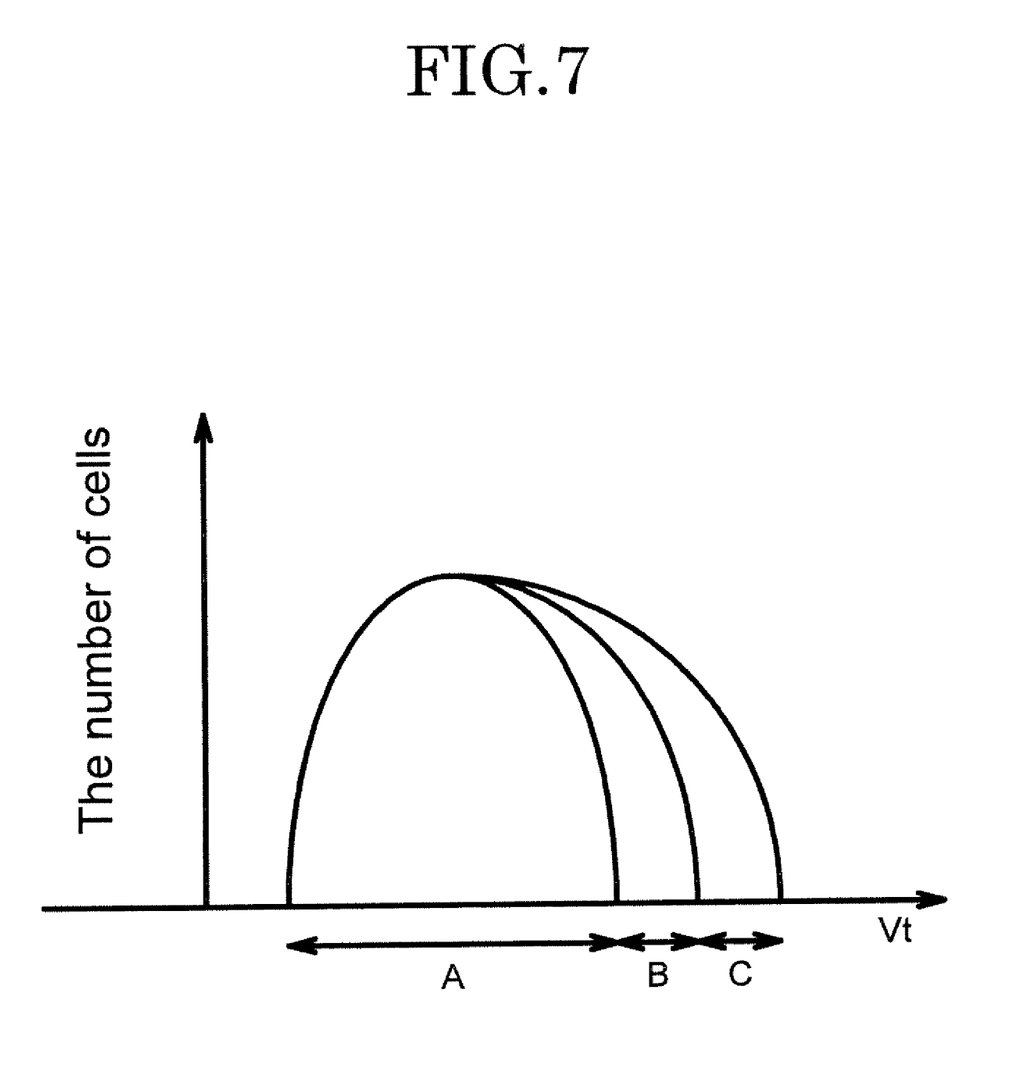
FIG. 7 illustrates the fluctuation of the distribution of threshold values when a flag cell of a NAND-type flash memory is influenced by surrounding flag cells due to capacitive coupling.

Generally, when data is written to a NAND-type flash memory, the data is first written to the cell farthest from the bit line BL. In FIG. 6, the longitudinal dashed line at the center is connected to the bit line BL (BL_m+2). Attention is then paid to this bit line BL (BL_m+2) and a flag cell (cell n−1) connected to a word line WLn−1. Simultaneously with or subsequent to the writing of flag data to this flag cell (cell n−1), five flag cells surrounding this flag cell (cell n−1) are written with flag data. Then, the flag cell (cell n−1) is influenced by the five flag cells due to capacitive coupling. This causes a fluctuation in the distribution of threshold values of the flag cell (cell n−1). With reference to FIG. 7, the following section will describe the fluctuation in the distribution of threshold values of a flag cell when the flag cell is influenced by surrounding flag cells due to capacitive coupling. In FIG. 7, the reference numeral "A" denotes the fluctuation in the distribution of the threshold values (Vt) of the flag cell when the flag cell is not influenced by capacitive coupling. In FIG. 7, the reference numeral "B" denotes the fluctuation in the distribution of the threshold values (Vt) of the flag cell when the flag cell is influenced by capacitive coupling. In FIG. 7, the reference numeral "C" denotes the fluctuation in the distribution of the threshold values (Vt) of the flag cell when the flag cell is influenced by capacitive coupling in the direction of the word line WL. As shown in FIG. 7, when the flag cell is influenced by capacitive coupling in the direction of the word line WL, the distribution of the threshold values (Vt) of the flag cell fluctuates significantly. This may damage the reliability of the flag data written to the flag cell.

Next, an embodiment of the nonvolatile semiconductor memory device of the present invention will be described. However, the present invention is not limited to this embodiment.

EMBODIMENT 1

Figure 1:
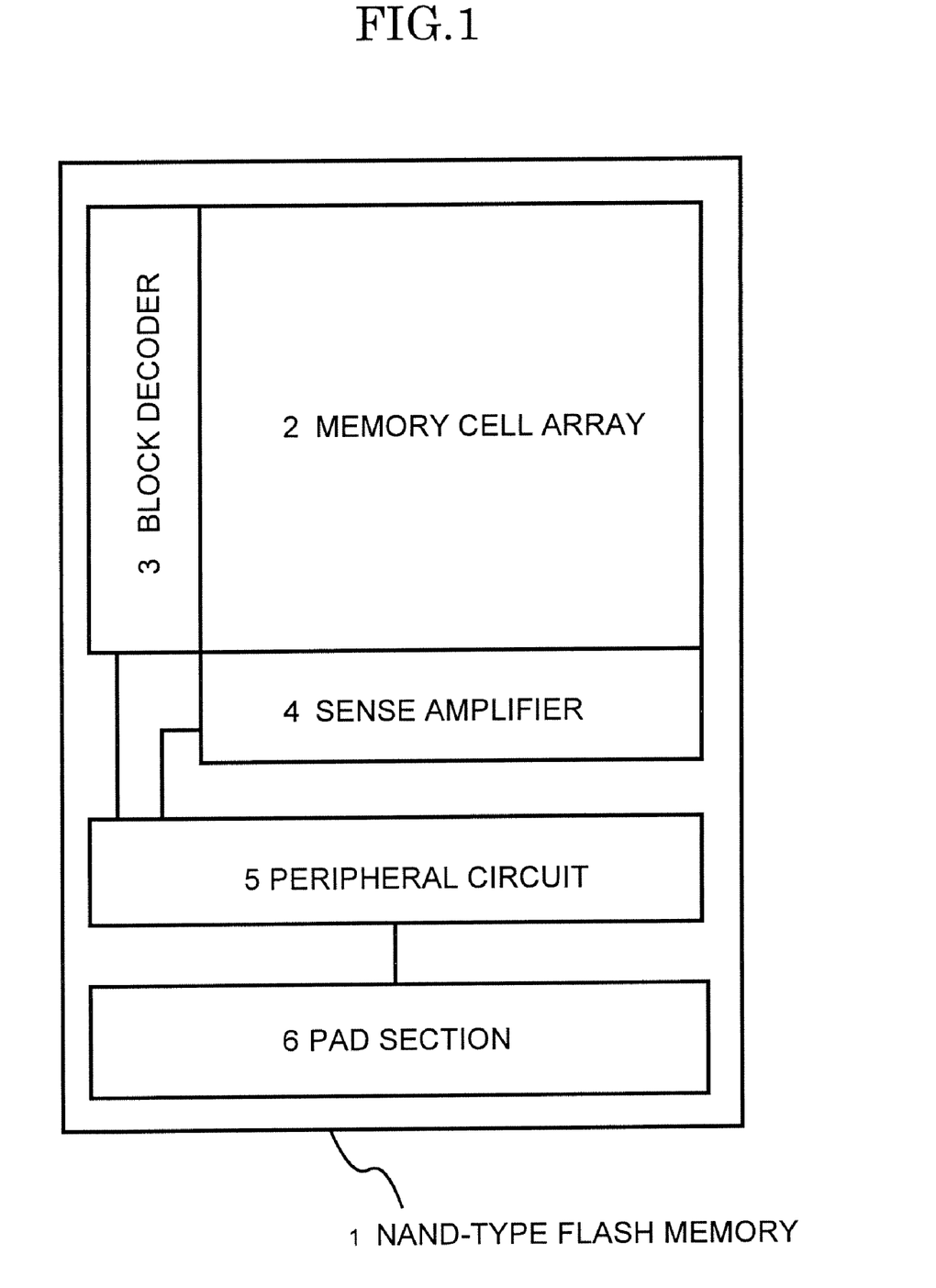
FIG. 1 is a schematic block diagram illustrating a NAND-type flash memory 1 according to one embodiment of a nonvolatile semiconductor memory device of the present invention.

FIG. 1 is a schematic block diagram illustrating the NAND-type flash memory 1 according to one embodiment of the nonvolatile semiconductor memory device of the present invention. The NAND-type flash memory 1 shown in FIG. 1 includes: a memory cell array 2 in which a plurality of electrically rewritable memory cells MTr are arranged in a matrix manner; a block decoder 3; a sense amplifier 4; a peripheral circuit 5; and a pad section 6.

Figure 2:
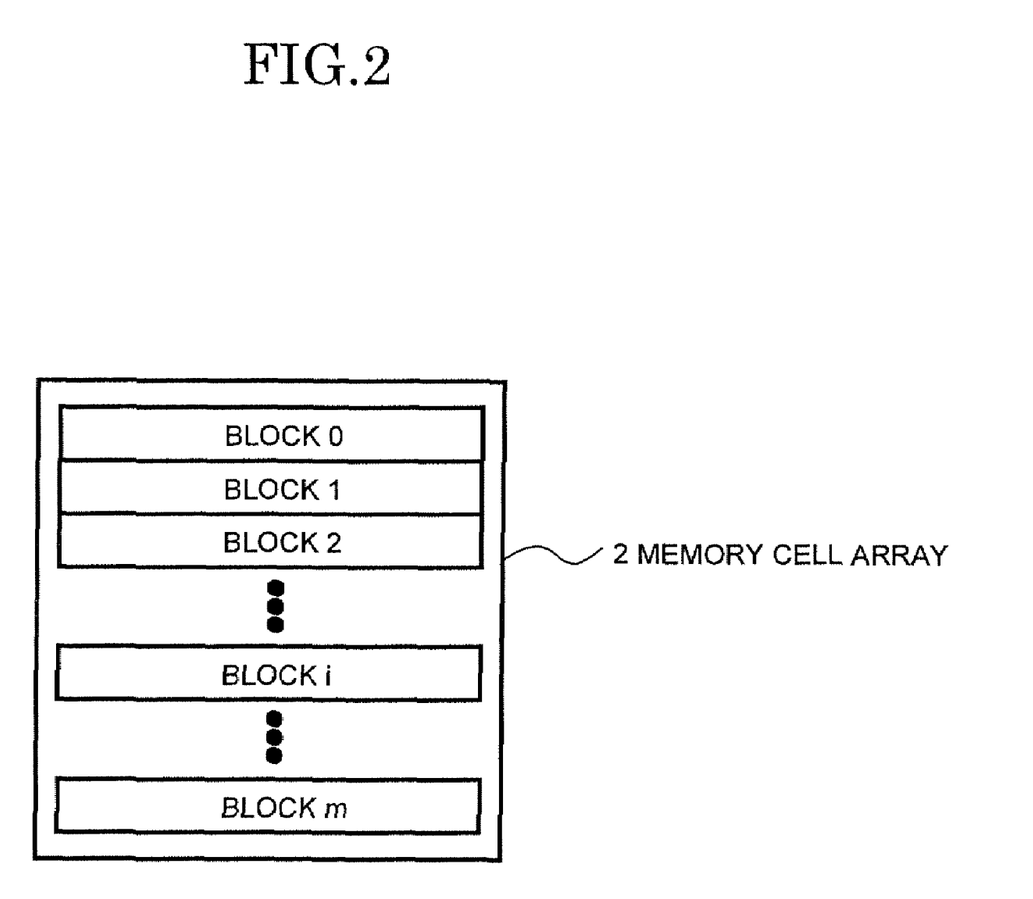
FIG. 2 illustrates the structure of a memory cell array 2 of the NAND-type flash memory 1 according to one embodiment of the nonvolatile semiconductor memory device of the present invention.

FIG. 2 illustrates the structure of the memory cell array 2. As shown in FIG. 2, the memory cell array 2 is divided into a total of "m" blocks (BLOCK0, BLOCK 1, BLOCK2, . . . , BLOCKi, . . . , BLOCKm). The term "block" herein refers to the minimum unit for data erasure.

Figure 3:
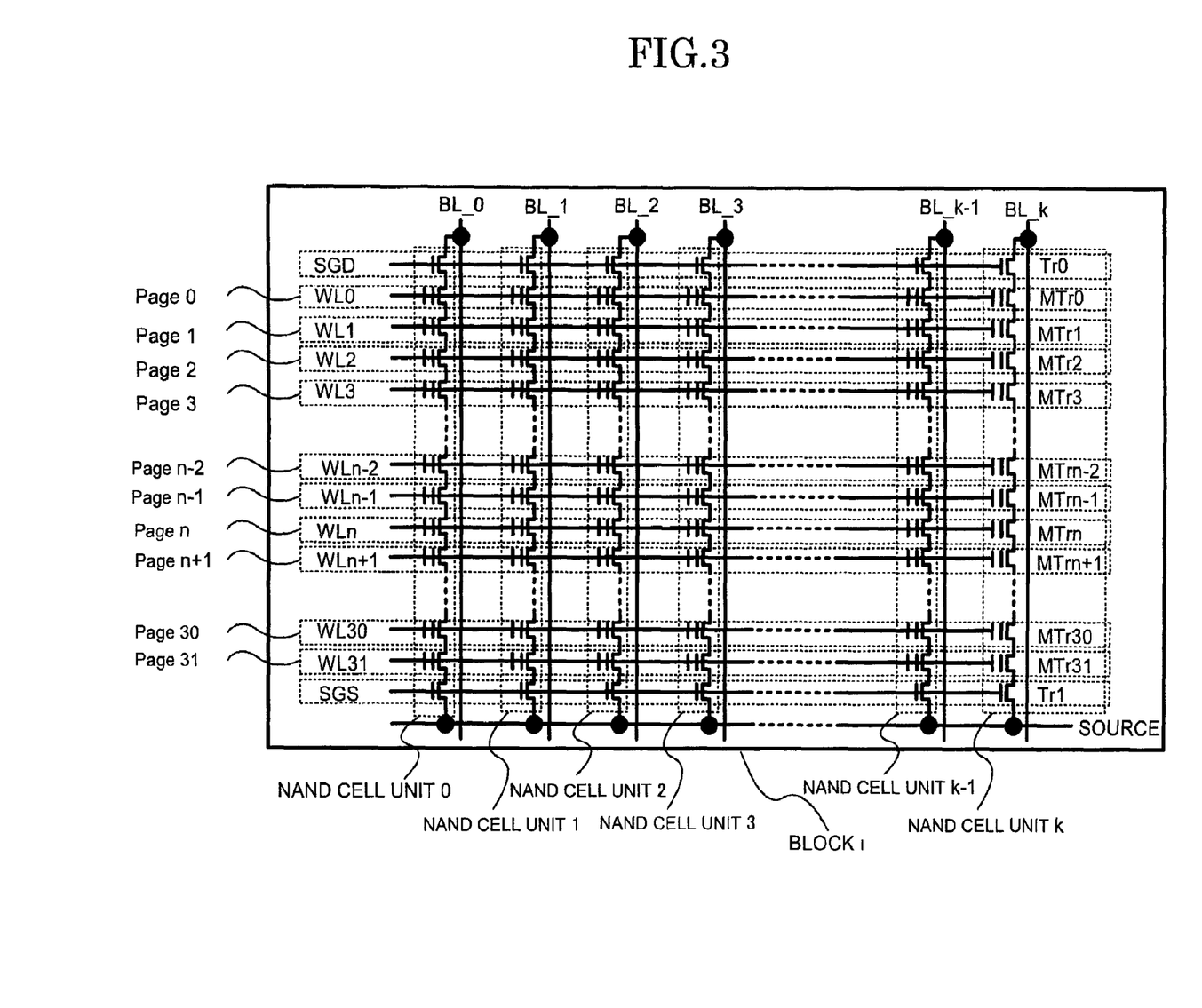
FIG. 3 illustrates the structure of a memory block BLOCKi of the NAND-type flash memory 1 according to one embodiment of the nonvolatile semiconductor memory device of the present invention.

The respective blocks BLOCK0 to BLOCKm are composed of "k" NAND cell units 0 to k as typically shown in the block BLOCKi in FIG. 3. In Embodiment 1, each of the NAND cell units is structured so that 32 memory cells MTr0 to MTr31 are connected in series and one end thereof is connected, via the selection gate transistor Tr0 connected to a selected gate line SGD, to the bit line BL (BL_0, BL_1, BL_2, BL_3, . . . , BL_k−1, BL_k) and the other end thereof is connected, via the selection gate transistor Tr1 connected to the selected gate line SGS, to the common source line SOURCE. Each of the memory cells MTr has a control gate that is connected to the word line WL (WL0 to WL31). One word line WL is connected with "k" memory cells MTr that memorize one bit data and the constitute a unit of "page".

Figure 4:
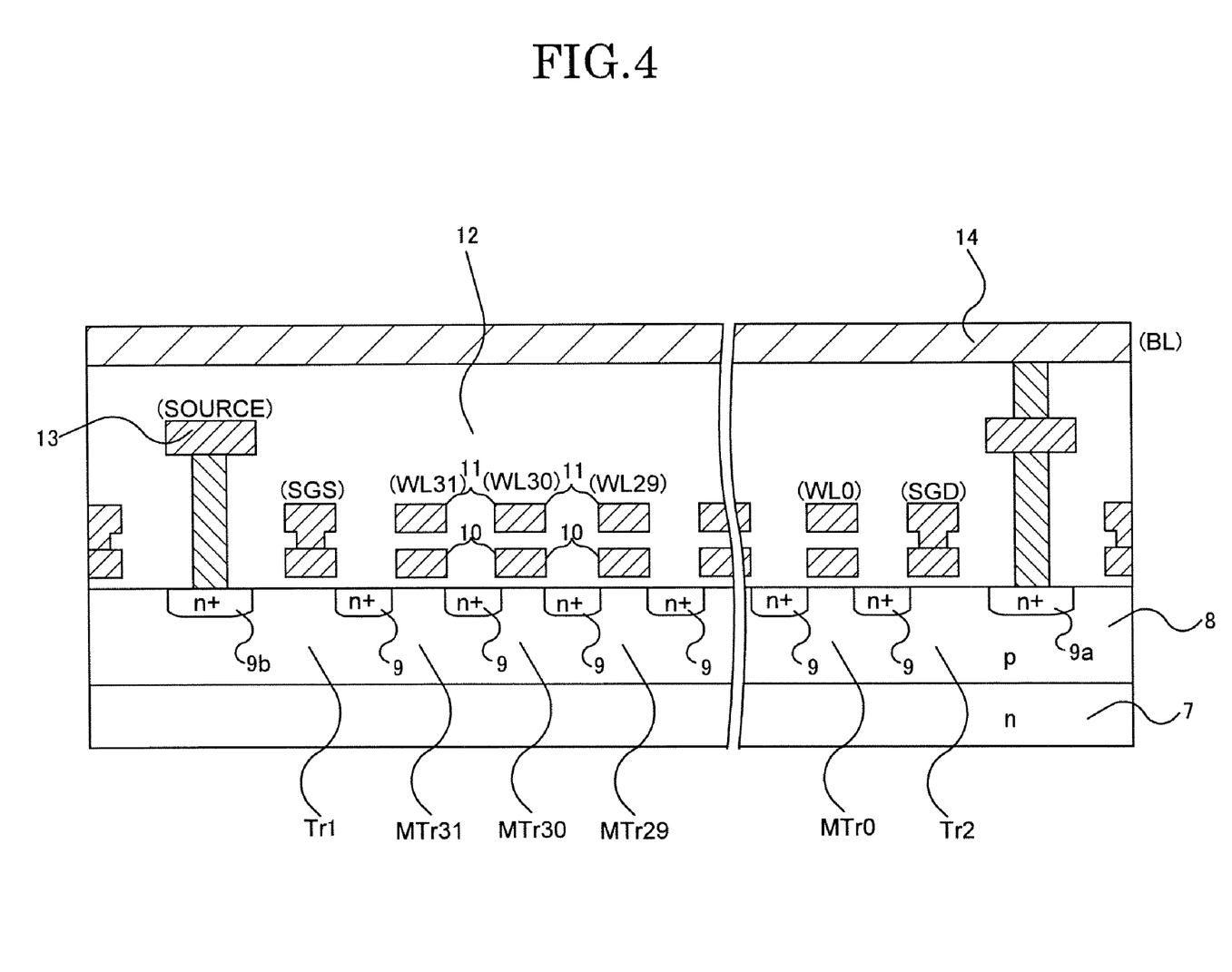
FIG. 4 is a cross-sectional view taken along a bit line BL of one NAND cell unit of the NAND-type flash memory 1 according to one embodiment of the nonvolatile semiconductor memory device of the present invention.

FIG. 4 shows a cross section along the bit line BL of one NAND cell unit of the NAND cell units 0 to k shown in FIG. 3. A memory cell MTr is formed in a p-type well 8 formed in an n-type silicon substrate or an n-type well 7. The memory cells MTr neighboring each other share a source/drain diffusion layer 9 and are composed of a laminated structure of a floating gate 10 and a control gate 11. The control gate 11 is patterned to the word line WL common to a plurality of memory cells MTr in a direction orthogonal to the surface of FIG. 4. The memory cell array 2 is covered by the interlayer insulation film 12. A common source line (SOURCE) 13 in a block buried in this interlayer insulation film 12 has contact with a source diffusion layer 9b of the selection gate transistor Tr1 at the common source line (SOURCE). A bit line (BL)14 formed on the interlayer insulation film 12 has contact with a drain diffusion layer 9a of the selection gate transistor Tr2 at the bit line BL. The contacts of these common source line (SOURCE) 13 and bit line (BL)1 4 are shared by neighboring memory cells MTr.

As described above, the NAND-type flash memory 1 is structured so that neighboring memory cells MTr in the NAND cell unit share a diffusion layer and neighboring NAND cell units share a wiring contact. Although the details will not be described, an element area and an element separation area are alternately arranged in a direction orthogonal to the surface of FIG. 4 to draw a stripe pattern and the memory cells MTr are formed at the respective intersection points of the respective element areas and the word lines WL orthogonal to the element areas in the stripe pattern. The structure as described above allows the NAND-type flash memory 1 to have a higher density and a higher capacity.

Figure 5:
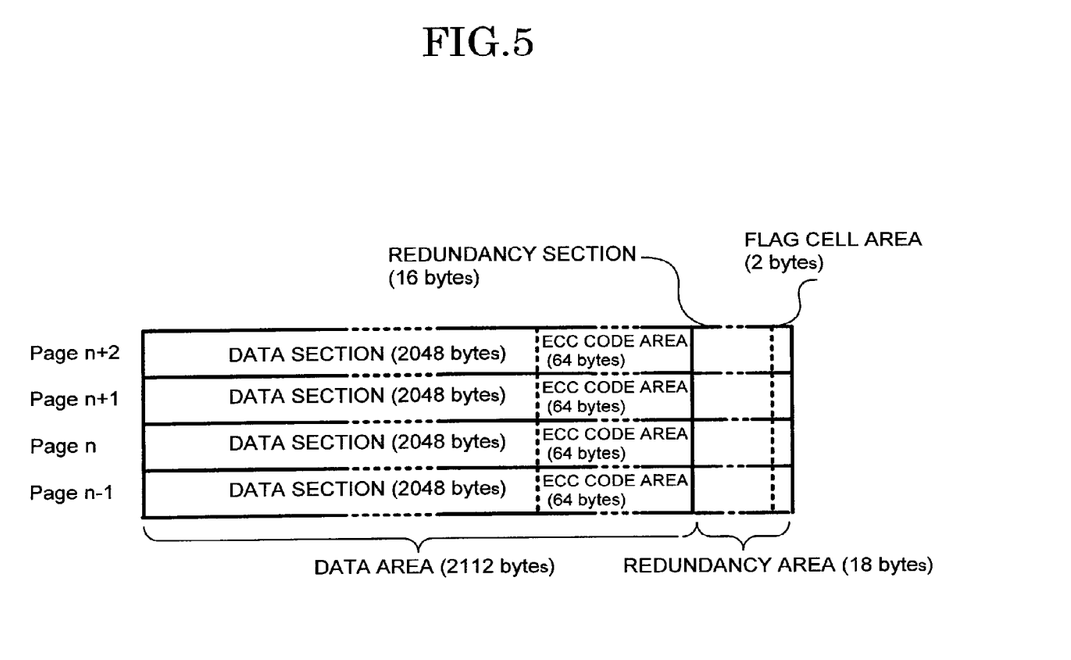
FIG. 5 illustrates an example of a page of the NAND-type flash memory 1 according to one embodiment of the nonvolatile semiconductor memory device of the present invention.

FIG. 5 illustrates an example of the structure of the page. FIG. 5 illustrates the page n−1 to page n+2 among the above-described page 0 to 31 of FIG. 3. As shown in FIG. 5, each of the pages of this example is composed of a data area of 2112 bytes and a redundancy area of 18 bytes. A data area consists of a data section of 2048 bytes and an ECC code area of 64 bytes. A redundancy area consists of a redundancy section of 16 bytes and a flag cell area of 2 bytes. This flag cell area memorizes important data (flag data) written with information for a page for example. Thus, the flag cell area is written with few bits of data of a flag cell area of 2 bytes. When a flag is determined, flag data of this flag cell area is determined by whether the flag data is right or wrong by determining whether the majority of the written few bits is correctly written or not. For the details of the data programming to a flag cell area, see the above Patent Publication 1. Although Embodiment 1 has described that a page is composed of a data section of 2048 bytes, an ECC code area of 64 bytes, a redundancy section of 16 bytes, and a flag cell area of 2 bytes, the present invention is not limited to this. The number of bytes of the respective sections may be changed depending on desired capacity.

Although Embodiment 1 also has described that the memory cell array 2 is composed of "m" blocks and one block includes "k" NAND cell units each of which consists of 32 memory cells, the present invention is not limited to this. The number of blocks, the number of the memory cells MTr, and the number of NAND cell units may be changed depending on desired capacity. Although Embodiment 1 has also described that each memory cell MTr memorizes one bit data, another configuration may also be used in which each memory cell MTr memorizes data of a plurality of bits (data of multivalued bits) depending on the amount of electron implantation.

Figure 8:
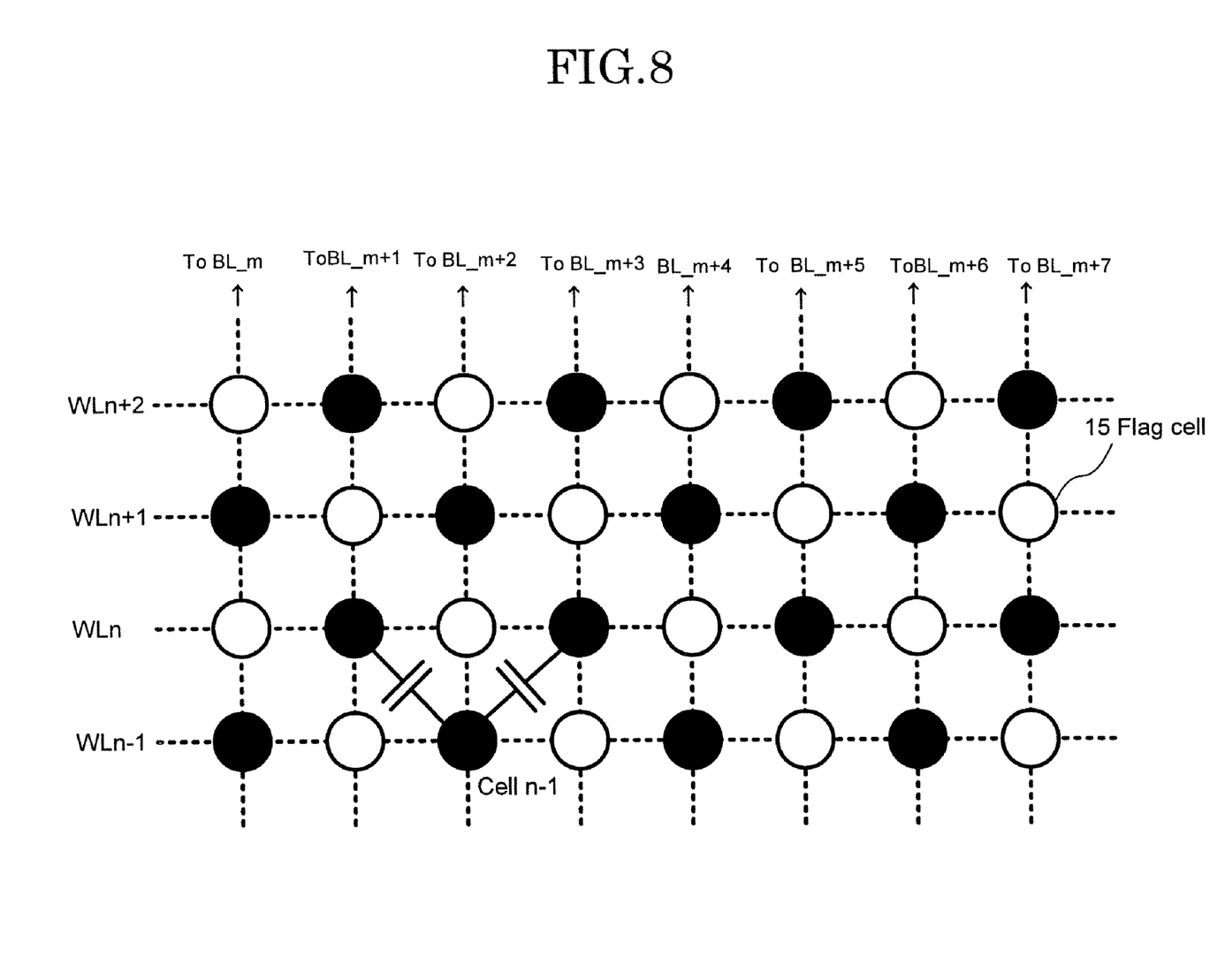
FIG. 8 is a schematic view illustrating an example of the influence upon a flag cell of the NAND-type flash memory 1 according to one embodiment of the nonvolatile semiconductor memory device of the present invention from surrounding flag cells due to capacitive coupling when the flag cell is written with data.

Next, with reference to FIG. 8, the following section will describe the influence by capacitive coupling from flag cells surrounding a flag cell of the NAND-type flash memory 1 of Embodiment 1 when the flag cell is written with data.

FIG. 8 illustrates a part of the flag cell area of the page and schematically illustrates the flag cell 15 written with flag data by ● (black circle) and the flag cell 15 not written with flag data by ○ (white circle). In FIG. 8, the longitudinal dashed line is connected to the bit line BL ( . . . , BL_m, BL_m+1, . . . , BL_m+7, . . . ). In FIG. 8, the lateral dashed line represents the word line WL( . . . , WLn−1, WLn, WLn+1, WLn+2, . . . ).

As shown in FIG. 8, the NAND-type flash memory 1 of Embodiment 1 is structured so that, among a plurality of flag cells 15 connected to one bit line BL ( . . . , BL_m, BL_m+1, . . . , BL_m+7, . . . ), every other flag cell arranged in the direction of the bit line BL is written with flag data. Specifically, when the flag cell 15 connected to a certain word line WL (e.g., word line WLn) among a plurality of flag cells 15 connected to one bit line BL ( . . . , BL_m, BL_m+1, . . . , BL_m+7, . . . ) is written with flag data, the flag cell 15 connected to the neighboring word line WL (word lines WLn−1 and WLn+1 adjacent to the word line WLn in this case) is not written with flag data. In a plurality of flag cells 15 connected to one word line WL, every other flag cell among a plurality of flag cells arranged in the direction of the word line WL is also written with flag data. Here, attention is paid to the flag cell (cell n−1) that is connected to the third bit line BL (BL_m+2) from left in FIG. 8 and that is connected to the word line WLn−1. Simultaneously with or subsequent to the writing of flag data to this flag cell (cell n−1), only two neighboring flag cells are written with data. Specifically, Embodiment 1 prevents, with regards to the flag cell (cell n−1) written with flag data, neighboring flag cells 15 in the direction of the word line WL from being written with flag data. Thus, the NAND-type flash memory 1 of Embodiment 1 prevents, in contrast with the above described case of FIG. 6, the influence by capacitive coupling in the direction of the word line WL. Furthermore, in contrast with the above-described case of FIG. 6 in which the direction of the bit line BL includes three flag cells 15 influenced by capacitive coupling, the NAND-type flash memory 1 of Embodiment 1 includes two flag cells 15 influenced by capacitive coupling. As a result, the NAND-type flash memory 1 of Embodiment 1 can reduce the fluctuation in the distribution of the threshold values (Vt) of the flag cell when compared with the above-described case in FIG. 7. Thus, although the NAND-type flash memory 1 of Embodiment 1 includes the flag cell not written with flag data and thus requires flag cells in an amount equal to or higher than twice the number of pieces of flag data to-be-written, the NAND-type flash memory 1 of Embodiment 1 does not damage the reliability of flag data written to the flag cell as in the above-described case in FIG. 6.

Figure 9:
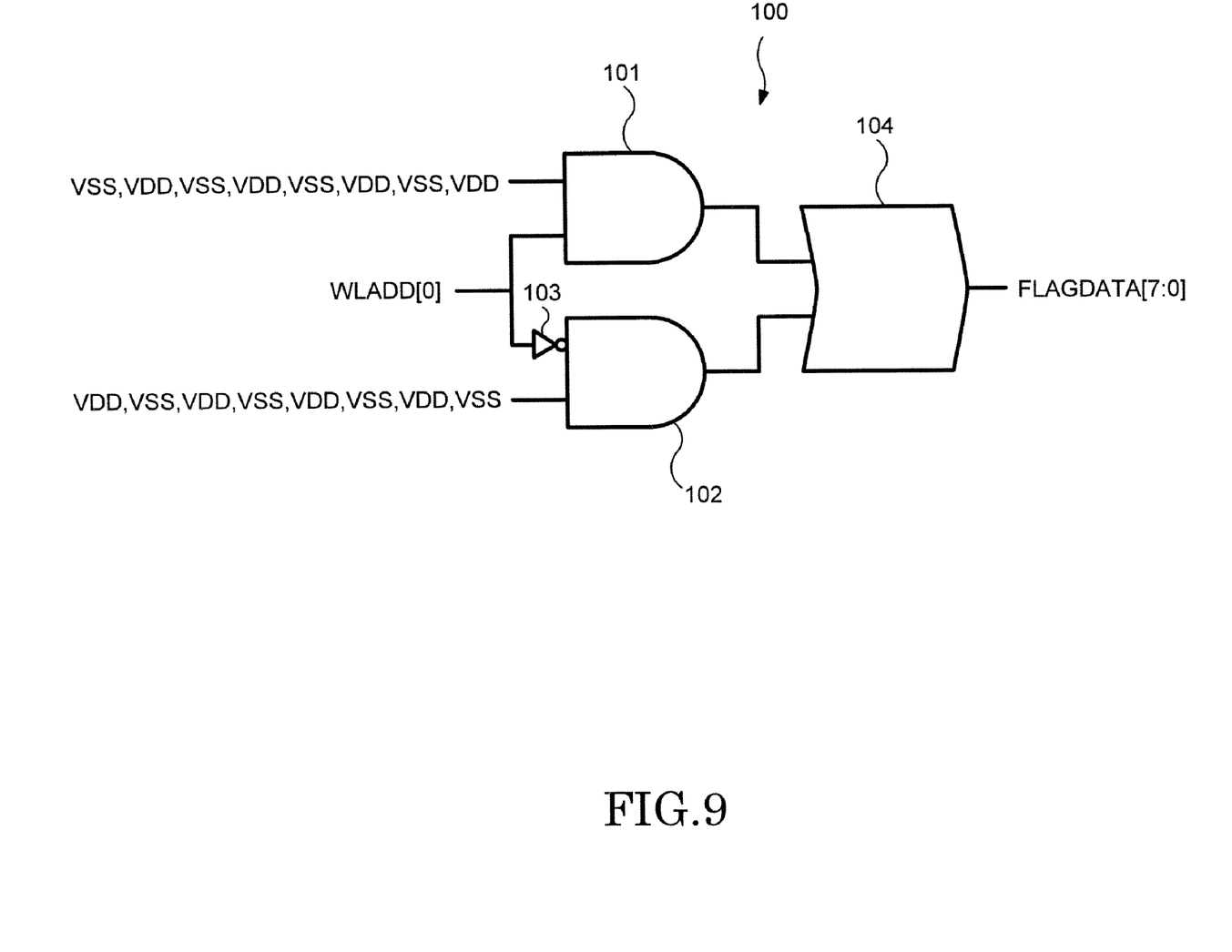
FIG. 9 is a circuit diagram illustrating an example of a selector circuit used for writing flag data to the NAND-type flash memory 1 according to one embodiment of the nonvolatile semiconductor memory device of the present invention.

The NAND-type flash memory 1 of Embodiment 1 may also further include a selector circuit for automatically writing data to the above flag cell area shown in FIG. 8. FIG. 9 illustrates an example of a selector circuit used for writing flag data in Embodiment 1. A selector circuit 100 includes: an AND gate (the first selection gate circuit) 101 that receives the lowest address signal (described later) and the first memory cell selection signal (described later) for selecting a plurality of flag cells (memory cell) and that outputs, depending on a change ("L" and "H") in the lowest address signal, the first memory cell selection signal; an AND gate (the second selection gate circuit) 102 that receives the lowest address signal inputted via the inverter 103 and the second memory cell selection signal (described later) for selecting a plurality of other flag cells (memory cells) and that outputs, depending on a change in the lowest address signal ("L" and "H"), the second memory cell selection signal; and an OR gate 104 that receives an output from the AND gate 101 and an output from the AND gate 102 and that outputs one of the outputs. In Embodiment 1, eight flag cells (8 bit) are connected to one word line WL. In order to select 32 word lines WL, 5 bit is required and is represented as WLADD[4:0]. In this case, different word lines WL can be selected depending on whether the lowest bit WLADD[0] (the lowest address signal) in neighboring word lines WL is "L" and whether the lowest bit WLADD[0] is "H". If such a selector circuit is obtained in which WLADD[0]="L" results in FLAGDATE[7:0]=[VSS, VDD, VSS, VDD, VSS, VDD, VSS, VDD] (the first memory cell selection signal) and WLADD[0]="H" results in FLAGDATE[7:0]=[VDD, VSS, VDD, VSS, VDD, VSS, VDD, VSS] (the second memory cell selection signal), flag data can be written to every other flag cell in Embodiment 1. It is noted that the term "VSS" represents a grounding potential (e.g., 0V) and the term "VDD" represents a power supply voltage.

Figure 10:
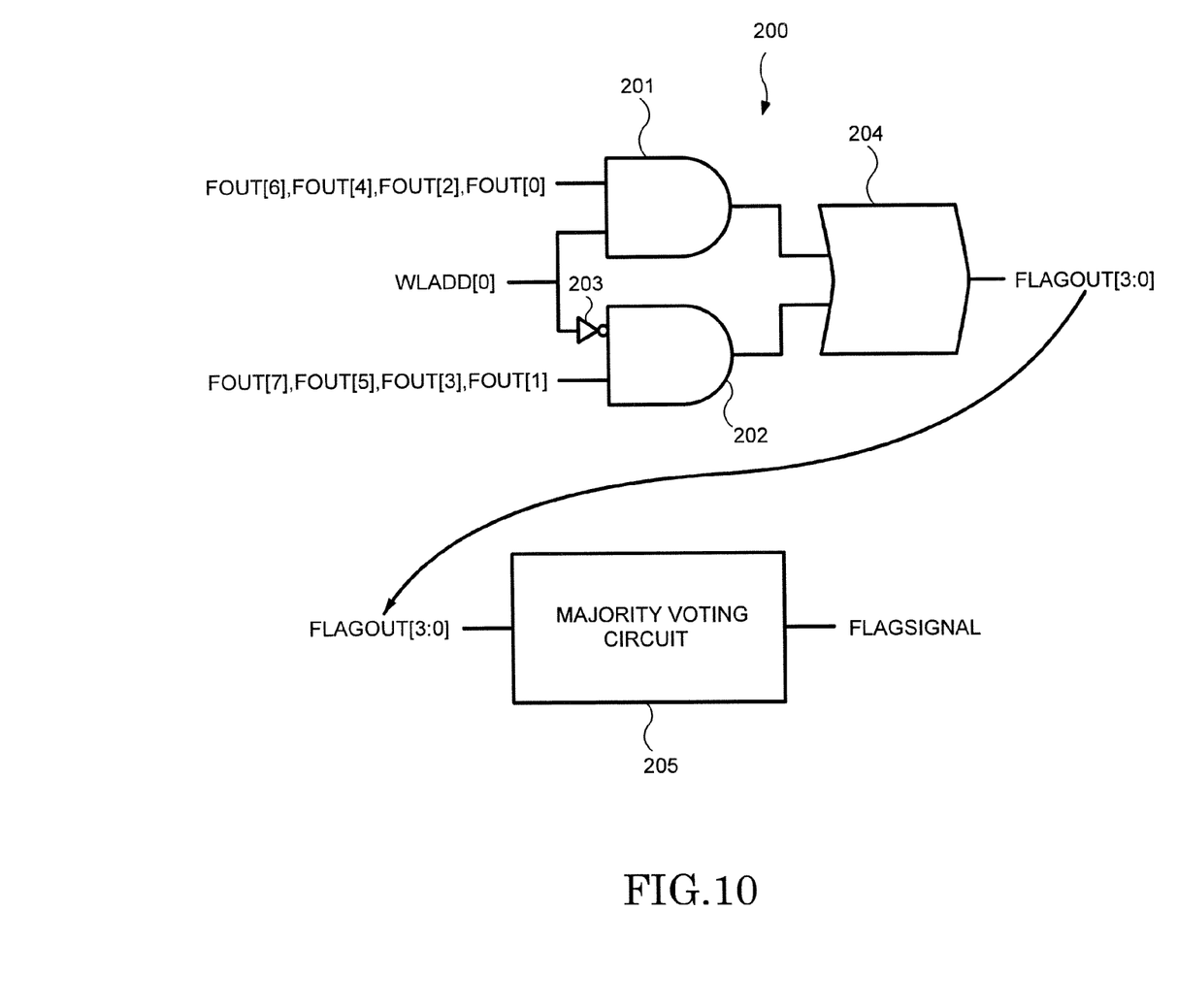
FIG. 10 is a circuit diagram illustrating an example of a flag decision circuit of the NAND-type flash memory 1 according to one embodiment of the nonvolatile semiconductor memory device of the present invention.

The NAND-type flash memory 1 of Embodiment 1 may also further include a flag decision circuit for deciding a flag based only on bit data when the data is written to the flag cell area of FIG. 8. FIG. 10 illustrates an example of the flag decision circuit in Embodiment 1. A flag decision circuit 200 includes: an AND gate (the first selection gate circuit) 201 that receives the lowest address signal and the first flag cell selection signal (described later) for selecting a flag cell area written with data for deciding a flag to output, depending on a change in the lowest address signal ("L" and "H"), the first flag cell selection signal; an AND gate (the second selection gate circuit) 202 that receives the lowest address signal inputted via the inverter 203 and the second flag cell selection signal (described later) for selecting another flag cell area written with data for deciding a flag to output, depending on a change in the lowest address signal ("L" and "H"), the second flag cell selection signal; an OR gate 204 that receives the output from the AND gate 201 and the output from the AND gate 202 to output any of the outputs; and a majority voting circuit 205 for subjecting the output from the OR gate 204 to a majority voting decision. In this example, eight flag cells (8 bit) are connected to one word line WL. In order to select 32 word lines WL, 5 bit is required and is represented as WLADD[4:0]. In this case, with regards to neighboring flag cells, data written to a different flag cell is decided according to whether the lowest bit WLADD[0] in neighboring flag cells is "L" or "H". In this case, WLADD[0]="L" results in FLAGOUT[3:0]=[FOUT[6], FOUT[4], FOUT[2], FOUT[0]] and WLADD[0]="H" results in FLAGOUT[3:0]= [FOUT[7], FOUT[5], FOUT[3], FOUT[1]]. The flag decision circuit is structured so that, when FLAGOUT[3:0] is inputted to the majority voting circuit, the flag decision circuit outputs a FLAGSIGNAL deciding that majority data is correctly written. In this manner, Embodiment 1 realizes a structure in which, when data is written to every other flag cell in a flag cell area, a flag can be decided based only on bit data of a flag cell written with the data.

EMBODIMENT 2

In Embodiment 2, another example of the nonvolatile semiconductor memory device of the present invention will be described.

The NAND-type flash memory 1 of Embodiment 2 has the same structure as that of the above-described NAND-type flash memory 1 of Embodiment 1 except that the respective blocks of the memory cell array 2 are partially different. Thus, the structure will not be further described herein below.

Figure 11:
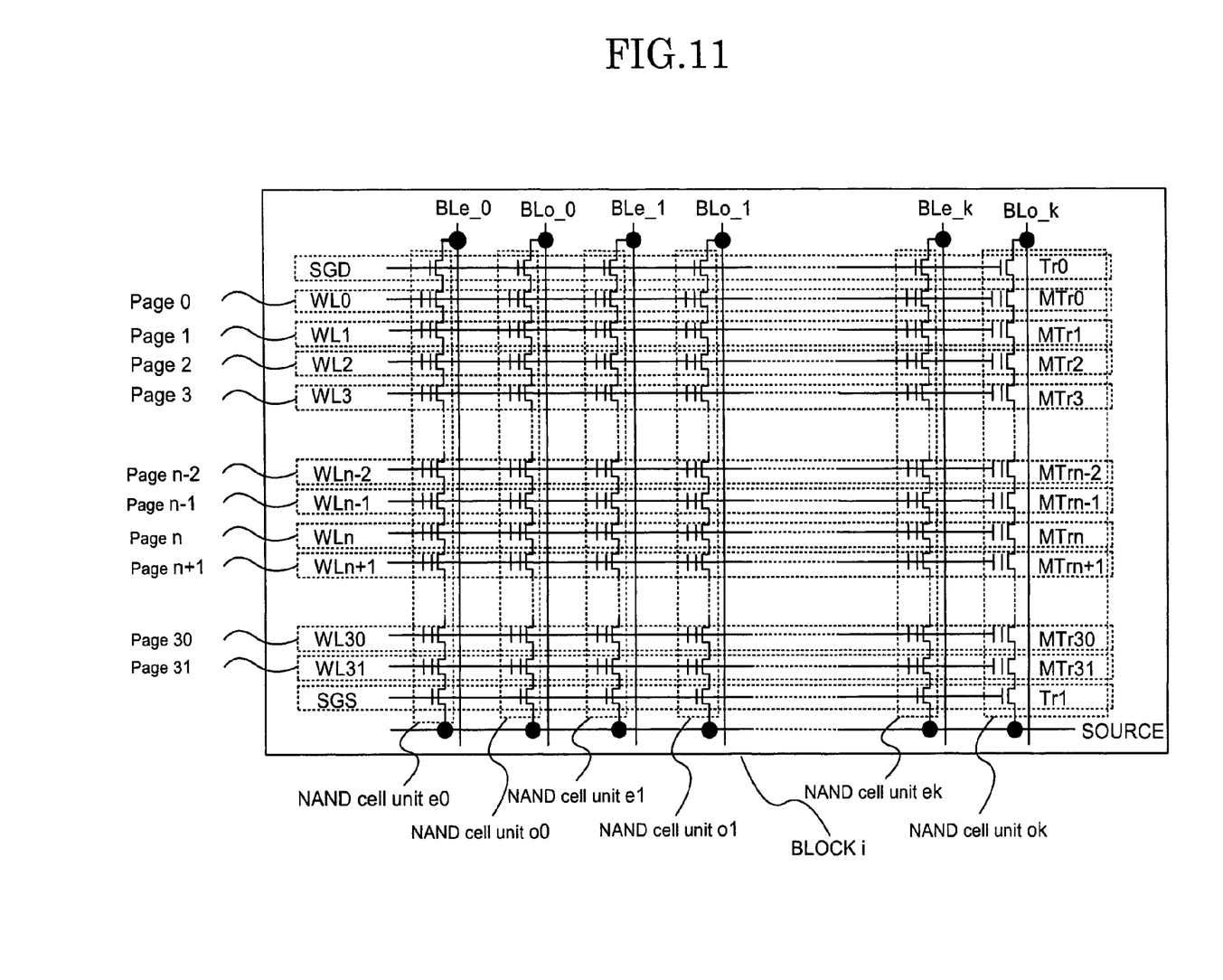
FIG. 11 illustrates the structure of a memory block BLOCKi of the NAND-type flash memory 1 according to one embodiment of the nonvolatile semiconductor memory device of the present invention.

FIG. 11 illustrates the structure of the BLOCKi of the NAND-type flash memory 1 according to Embodiment 2. The NAND-type flash memory 1 according to Embodiment 2 is the so-called Shared Bit Line-type NAND-type flash memory in which a plurality of NAND cell units (two NAND cell units in Embodiment 2) share one bit line BL. Specifically, two NAND cell units of an even numbered NAND cell unit (NAND cell unit e0, NAND cell unit e1, . . . , NAND cell unit eke) and an odd numbered NAND cell unit (NAND cell unit o0, NAND cell unit o1, . . . , NAND cell unit oK) from 0 (zero) share one bit line BL_0, BL_1, . . . , BL_k. It is noted that, in the structure shown in FIG. 11, one bit line BL_0, BL_1, . . . , BL_k shown in FIG. 3 as described above is divided into bit lines BLe_0, BLe_1, . . . , BLe_k (hereinafter may be collectively referred to as "BLe") and a bit line BLo_0, BLo_1, . . . , BLo_k (hereinafter may be collectively referred to as "BLo"). Data is written to and read out from the bit line BLe and the bit line BLo so that the bit line BLe and the bit line BLo are independent from each other. When data is written to and read out from a certain memory cell MTr the system as described above allows a neighboring bit line (BLo or BLe) adjacent to a bit line (BLe or BLo) connected to the memory cell MTr to be applied with a VSS (grounding potential, e.g., 0V) to prevent the influence of capacitive coupling from the memory cell MTr connected to the neighboring bit line (Blo or BLe). Among "2×k" memory cells MTr connected to one word line WL, "k" memory cells MTr connected to the bit line BLe are simultaneously subjected to data programming and data reading. These "k" memory cells MTr constitute a unit of "page".

Similarly, "k" memory cells that are connected to one word line WL and are connected to the bit line Blo constitute another one page. The memory cells MTr within this page are simultaneously subjected to data programming and data reading.

Figure 12:
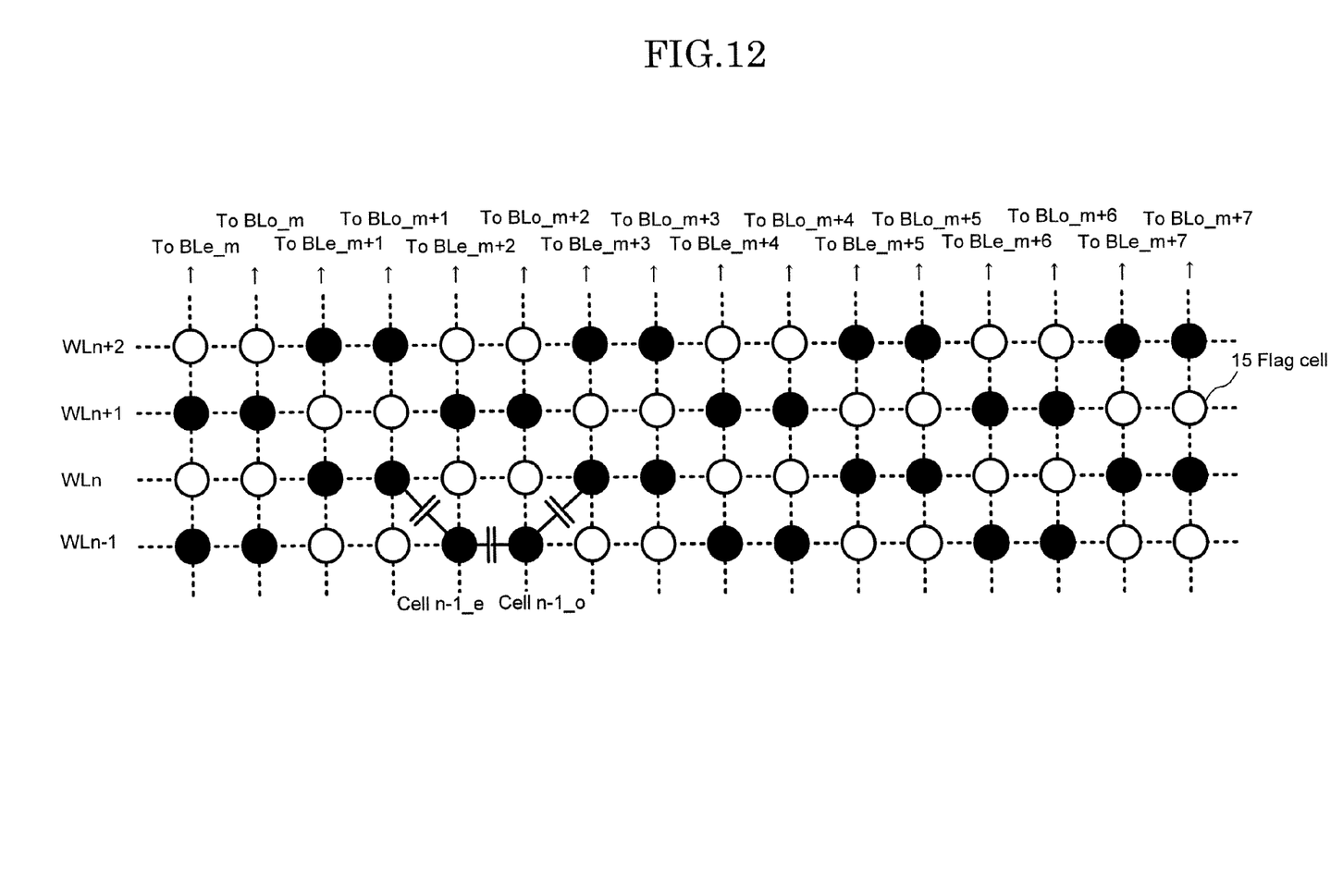
FIG. 12 is a schematic view illustrating an example of the influence upon a flag cell of the NAND-type flash memory 1 according to one embodiment of the nonvolatile semiconductor memory device of the present invention from surrounding flag cells due to capacitive coupling when the flag cell is written with data.

Next, the following section will describe, with reference to FIG. 12, the influence by capacitive coupling from the flag cells surrounding a flag cell of the NAND-type flash memory 1 of Embodiment 2 when the flag cell is written with data. FIG. 12 illustrates a part of a flag cell area of a page and schematically illustrates the flag cell 15 written with flag data by ● (black circle) and the flag cell 15 not written with flag data by ○ (white circle). In FIG. 12, the longitudinal dashed line is connected to the bit line BLe ( . . . , BLe_m, BLe_m+1, . . . , BLe_m+7, . . . ) or the bit line Blo ( . . . , BLo_m, BLo_m+1, . . . , BLo_m+7, . . . ) . Here, the bit line BLe ( . . . , BLe_m, BLe_m+1, . . . , BLe_m+7, . . . ) and the bit line BLo ( . . . , BLo_m, BLo_m+1, . . . , BLo_m+7, . . . ) shown from the left side of FIG. 12 are divided from one bit line BL ( . . . , BL_m, BL_m+1, . . . , BL_m+7, . . . ), respectively. In FIG. 12, the lateral dashed line represents the word line WL ( . . . , WLn−1, WLn, WLn+1, WLn+2, . . . ).

As shown in FIG. 12, the NAND-type flash memory 1 of Embodiment 2 is structured so that, in a plurality of flag cells 15 that are connected to one bit line BL ( . . . , BL_m, BL_m+1, . . . , BL_m+7, . . . ,), every other flag cell of a plurality of flag cells arranged in the direction of the bit line BL is written with flag data. Specifically, when a flag cell 15 connected to a certain word line WL (e.g., word line WLn) among a plurality of flag cells 15 connected to one bit line BL ( . . . , BL_m, BL_m+1, . . . , BL_m+7, . . . ) is written with flag data, the flag cell 15 connected to the neighboring word line WL adjacent to the certain word line WL (word lines WLn−1 and WLn+1 in this case) is not written with flag data. In a plurality of flag cells 7 connected to one word line WL, a flag cell 15 written with data and a flag cell 15 not written with data are alternately provided, for every group of a plurality of flag cells 15 (two flag cells 15 in this example) that share one bit line BL ( . . . , BL_m, BL_m+1, . . . , BL_m+7, . . . ,), in the direction of the word line WL. Here, attention is paid to the flag cell (cell n−1_e) that is connected to the third bit line BLe (BLe_m+2) from left in FIG. 12 and that is connected to the word line WLn−1. Those flag cells surrounding this flag cell (cell n−1_e) that are written with data simultaneously with or subsequently to the writing of flag data to this flag cell (cell n−1_e) are two flag cells of a neighboring flag cell (cell n−1_o) in the direction of the word line WL and a flag cell in the direction of the bit line BL. Similarly, attention is paid to the flag cell (cell n−1_o) that is connected to the third bit line BLo (BLo_m+2) from left in FIG. 12 and that is connected to the word line WLn−1. Those flag cells surrounding this flag cell (cell n−1_o) that are written with data simultaneously with or subsequently to the writing of flag data to this flag cell (cell n−1_o) in this case are also two flag cells of a neighboring flag cell (cell n−1_e) in the direction of the word line WL and a flag cell in the direction of the bit line BL. As described above, while the above-described case in FIG. 6 results in the five flag cells 15 influenced by the capacitive coupling of two flag cells 15 in the direction of the word line WL and three flag cells 15 in the direction of the bit line BL, the NAND-type flash memory 1 of Embodiment 2 results in two flag cells 15 influenced by the capacitive coupling of one flag cell 15 in the direction of the word line WL and one flag cell 15 in the direction of the bit line BL. Thus, the NAND-type flash memory 1 of Embodiment 2 can also reduce the fluctuation in the distribution of the threshold values (Vt) of the flag cell when compared with the above-described case shown in FIG. 7. Thus, the NAND-type flash memory 1 of Embodiment 2 also does not damage the reliability of flag data written to the flag cell as in the above-described case of FIG. 6.

A nonvolatile semiconductor memory device according to one embodiment of the present invention may also be structured so that a plurality of memory cell units share one bit line and data is written to a flag cell area by, a memory cell written with data and a memory cell not written with data in the word line direction, alternately providing, for every group of a plurality of memory cells sharing one bit line, instead of writing data to alternation memory cell among a plurality of memory cells arranged in one word line direction in a plurality of memory cells connected to the word line.

The nonvolatile semiconductor memory device according to Embodiment 2 of the present invention preferably has the selector circuit 100 shown in FIG. 9. This selector circuit 100 is used so that the lowest address of a word line is used to automatically write data to a flag cell area.

The nonvolatile semiconductor memory device according to Embodiment 2 of the present invention may also have the flag decision circuit 200 shown in FIG. 10 as described above so that, when this flag decision circuit 200 is used to write data to a flag cell area, a flag is decided based only on the bit data.

The nonvolatile semiconductor memory device according to one embodiment of the present invention is not particularly limited and may be a NAND-type flash memory for example.

We claim:

1. A nonvolatile semiconductor memory device comprising:
    a memory cell array having a plurality of memory cell units in which a plurality of electrically rewritable memory cells are connected in series;
    a plurality of word lines respectively connected to control gates of said plurality of electrically rewritable memory cells;
    a plurality of bit lines each being connected to one end of said plurality of memory cell units; and
    a plurality of source lines each being connected to another end of said plurality of memory cell units, wherein
    said plurality of electrically rewritable memory cells which are connected to each of said plurality of word lines constitute a unit called a page, wherein said page has a flag cell area, and
    when said flag cell area is written with data, in said plurality of electrically rewritable memory cells within said flag cell area, every other memory cell among said plurality of electrically rewritable memory cells which are arranged in a bit line direction are written with said data, and also every other memory cell among said plurality of electrically rewritable memory cells which are arranged in a word line direction are written with said data.

2. The nonvolatile semiconductor memory device according to claim 1, wherein said data is written to said flag cell area using a selector circuit which uses the lowest address signal of a plurality of address signals, said lowest address signal being used to select each memory cell of said plurality of electrically rewritable memory cells connected to a word line of said plurality of word lines.

3. The nonvolatile semiconductor memory device according to claim 2, wherein said selector circuit has a selection gate circuit which selects a memory cell to be written with said data among said plurality of electrically rewritable memory cells which are arranged in the word line direction based on said lowest address signal.

4. The nonvolatile semiconductor memory device according to claim 3, wherein said selection gate circuit receives said lowest address signal and changes a selection of a memory cell to be written among said plurality of electrically rewritable memory cells which are arranged in said word line direction based on a change of said lowest address signal.

5. The nonvolatile semiconductor memory device according to claim 4, said selection gate circuit comprises:
    a first selection gate circuit being input said lowest address signal and a first memory cell selection signal selecting said plurality of electrically rewritable memory cells, said first selection gate circuit outputting said first memory cell selection signal according to said change in said lowest address signal; and
    a second selection gate circuit being input said lowest address signal and a second memory cell selection signal selecting other memory cells different from said plurality of electrically rewritable memory cells selected by said first memory cell selection signal, said second selection gate circuit outputting said second memory cell selection signal according to said change in said lowest address signal.

6. The nonvolatile semiconductor memory device according to claim 1, wherein
    said nonvolatile semiconductor memory device has a flag decision circuit and
    wherein said flag decision circuit decides a flag based only on said data which is written to said flag cell area when said flag cell area is written with said data.

7. The nonvolatile semiconductor memory device according to claim 6, wherein said flag decision circuit decides said flag based only on said data which is written to said flag cell area based on a lowest address signal.

8. The nonvolatile semiconductor memory device according to claim 7, wherein said flag decision circuit receives said lowest address signal and decides said flag based only on said data which is written to said flag cell area based on a change in said lowest address signal.

9. The nonvolatile semiconductor memory device according to claim 8, said flag decision circuit comprising:
    a first selection gate circuit being input said lowest address signal and a first flag cell selection signal selecting said flag cell area written with said data deciding said flag, said first selection gate circuit outputting said first flag cell selection signal according to said change in said lowest address signal;
    a second selection gate circuit being input said lowest address signal and a second flag cell selection signal selecting a different flag cell area to said flag cell area selected by said first flag cell selection signal, said different flag cell area being written with said data deciding said flag, and said second selection gate circuit outputting said second flag cell selection signal according to said change in said lowest address signal; and
    a majority voting circuit being input said first or second flag cell selection signal and judging whether said data is written in a majority of said plurality of memory cells selected by said first or second flag cell selection signal in said flag cell area or not.

10. The nonvolatile semiconductor memory device according to claim 1, wherein said nonvolatile semiconductor memory device is a NAND-type flash memory.

11. A nonvolatile semiconductor memory device comprising:
    a memory cell array having a plurality of memory cell units in which a plurality of electrically rewritable memory cells are connected in series;
    a plurality of word lines respectively connected to control gates of said plurality of electrically rewritable memory cells;
    a plurality of bit lines each being connected to one end of said plurality of memory cell units; and
    a plurality of source lines each being connected to another end of said plurality of memory cell units, wherein
    said plurality of electrically rewritable memory cells which are connected to each of said plurality of word lines constitute a unit called a page, wherein said page has a flag cell area,
    adjacent memory cell units of said plurality of memory cell units are connected to one bit line, and
    when said flag cell area is written with data, in said plurality of electrically rewritable memory cells which are connected to a word line among said plurality of word lines, adjacent memory cells of said plurality of electrically rewritable memory cells which are written with said data and adjacent memory cells of said plurality of electrically rewritable memory cells which are not written with said data are alternately arranged for each of said plurality of memory cell units which share one bit line in a word line direction.

12. The nonvolatile semiconductor memory device according to claim 11, wherein said data is written to said flag cell area using a selector circuit which uses the lowest address signal of a plurality of address signals, said lowest address signal being used to select each memory cell of said plurality of electrically rewritable memory cells connected to the word line.

13. The nonvolatile semiconductor memory device according to claim 12, wherein said selector circuit has a selection gate circuit which selects a memory cell to be written with said data among said plurality of electrically rewritable memory cells which are arranged in the word line direction based on said lowest address signal.

14. The nonvolatile semiconductor memory device according to claim 13, wherein said selection gate circuit receives said lowest address signal and changes a selection of the memory cell to be written among said plurality of electrically rewritable memory cells which are arranged in said word line direction based on a change of said lowest address signal.

15. The nonvolatile semiconductor memory device according to claim 14, said selection gate circuit comprising:
a first selection gate circuit being input said lowest address signal and a first memory cell selection signal selecting said plurality of electrically rewritable memory cells, said first selection gate circuit outputting said first memory cell selection signal according to said change in said lowest address signal; and
a second selection gate circuit being input said lowest address signal and a second memory cell selection signal selecting other memory cells different from said plurality of electrically rewritable memory cells selected by said first memory cell selection signal, said second selection gate circuit outputting said second memory cell selection signal according to said change in said lowest address signal.

16. The nonvolatile semiconductor memory device according to claims 11, wherein
said nonvolatile semiconductor memory device has a flag decision circuit and
wherein said flag decision circuit decides a flag based only on said data which is written to said flag cell area when said flag cell area is written with said data.

17. The nonvolatile semiconductor memory device according to claim 16, wherein said flag decision circuit decides said flag based only on said data which is written to said flag cell area based on a lowest address signal.

18. The nonvolatile semiconductor memory device according to claim 17, wherein said flag decision circuit receives said lowest address signal and decides said flag based only on said data which is written to said flag cell area based on a change in said lowest address signal.

19. The nonvolatile semiconductor memory device according to claim 18, said flag decision circuit comprising:
a first selection gate circuit being input said lowest address signal and a first flag cell selection signal selecting said flag cell area written with said data deciding said flag, said first selection gate circuit outputting said first flag cell selection signal according to said change in said lowest address signal;
a second selection gate circuit being input said lowest address signal a second flag cell selection signal selecting a different flag cell area to said flag cell area selected by said first flag cell selection signal, said different flag cell area being written with said data deciding said flag, and said second selection gate circuit outputting said second flag cell selection signal according to said change in said lowest address signal; and
a majority voting circuit being input said first or second flag cell selection signal and judging whether said data is written in a majority of said plurality of memory cells selected by said first or second flag cell selection signal in said flag cell area or not.

20. The nonvolatile semiconductor memory device according to claim 11, wherein said nonvolatile semiconductor memory device is a NAND-type flash memory.

* * * * *